United States Patent
Tsai et al.

(10) Patent No.: US 9,910,350 B2
(45) Date of Patent: Mar. 6, 2018

(54) METHOD FOR REPAIRING A MASK

(71) Applicant: Taiwan Semiconductor Manufacturing Company, Ltd., Hsin-Chu (TW)

(72) Inventors: Shang-Lun Tsai, Hsinchu (TW); Sheng-Chi Chin, Hsinchu (TW); Yuan-Chih Chu, New Taipei (TW); Yueh-Hsun Li, Kaohsiung (TW)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 142 days.

(21) Appl. No.: 14/941,876

(22) Filed: Nov. 16, 2015

(65) Prior Publication Data

US 2017/0139321 A1   May 18, 2017

(51) Int. Cl.
  *G03F 1/22*  (2012.01)
  *G03F 1/72*  (2012.01)
  *G03F 1/26*  (2012.01)
(52) U.S. Cl.
  CPC . *G03F 1/72* (2013.01); *G03F 1/26* (2013.01)
(58) Field of Classification Search
  None
  See application file for complete search history.

(56) References Cited

U.S. PATENT DOCUMENTS

| | | | |
|---|---|---|---|
| 8,628,897 B1 | 1/2014 | Lu et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 2004/0151991 A1* | 8/2004 | Stewart | G03F 1/74 430/5 |
| 2005/0285033 A1* | 12/2005 | Takaoka | G01N 23/00 250/309 |
| 2006/0099517 A1* | 5/2006 | Sugawara | B82Y 10/00 430/5 |
| 2006/0147814 A1* | 7/2006 | Liang | G03F 1/72 430/5 |

* cited by examiner

Primary Examiner — Stephen Rosasco
(74) Attorney, Agent, or Firm — Haynes and Boone, LLP

(57) ABSTRACT

The present disclosure provides a method of repairing a mask. The method includes receiving a mask that includes a patterned feature, the patterned feature producing a phase-shift and having a transmittance; identifying a defect region on the mask; and forming a repair feature over the defect region on the mask, wherein forming the repair feature includes forming a first patterned material layer over the defect region and forming a second patterned material layer over the first patterned material layer to form the repair feature, the repair feature producing the phase-shift and having the transmittance.

20 Claims, 4 Drawing Sheets

METHOD FOR REPAIRING A MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example associated with lithography patterning, a photomask (or mask) to be used in a lithography process has a circuit pattern defined thereon and is to be transferred to wafers. The pattern on the mask needs to be more accurate and the lithography patterning is more sensitive to the mask defects for small feature sizes in the advanced technology nodes. Accordingly, a mask is repaired to eliminate defects and is further checked to validate the repaired defects.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
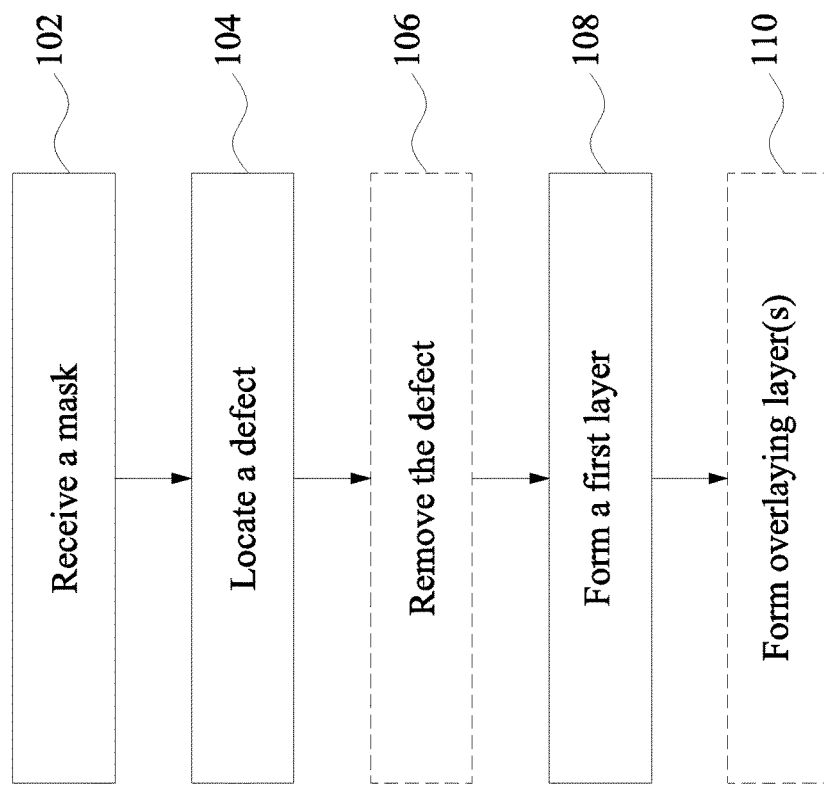
FIG. 1 is a flowchart of a method for repairing a mask according to one or more embodiments of the present invention.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
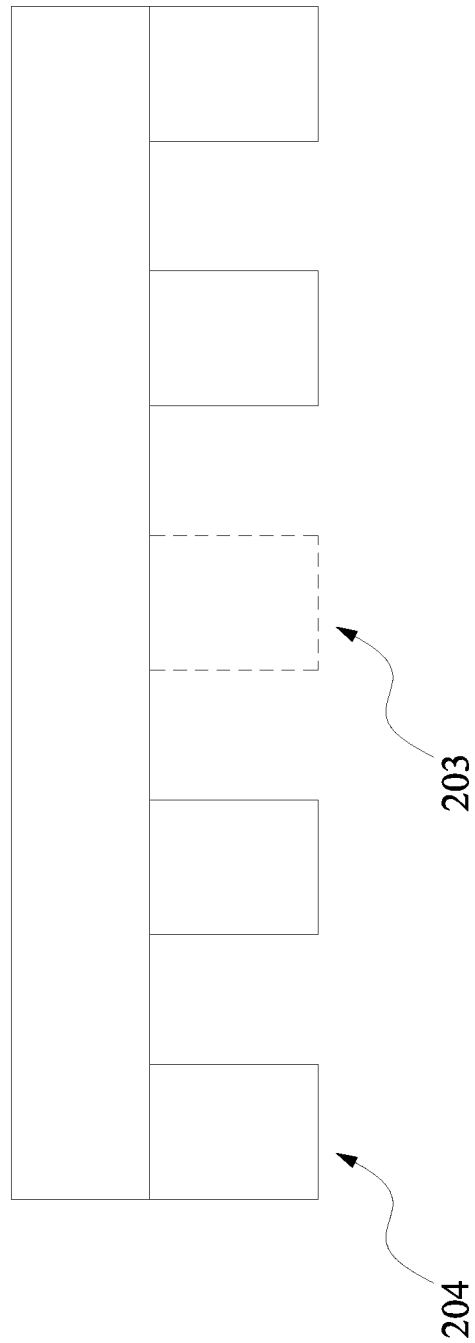
FIG. 2A is a cross-sectional view of a phase shift mask (PSM) including a defect according to one or more embodiments of the present invention.

FIG. 1 is a flowchart of a method 100 of repairing a defect on a mask constructed according to various aspects of the present disclosure in one or more embodiments. The method 100 is described with reference to FIG. 1 and in conjunction with FIGS. 2A, 2B, and 2C. The mask repairing may be implemented in a mask shop for making a mask, in a fab for fabricating a semiconductor device on a wafer using a mask, in a glass factory for manufacturing a mask blanket, and/or any other location. It is understood that additional steps can be provided before, during, and/or after the method 100, and some of the steps described can be replaced, eliminated, and/or moved around for additional embodiments of the method 100.

The method 100 begins at operation 102 with receiving or providing a mask 200. The mask 200 is used to fabricate semiconductor wafers during lithography processes. In a specific embodiment, the mask 200 is a phase shift mask (PSM). In the illustrated embodiment of FIG. 2A, the mask 200 includes a substrate 202, a pattern formed 204, and a defect 203. The pattern is defined according to a circuit design. Generally, using the example of implementing the mask 200 as a PSM, the substrate 202 may be a transparent quartz substrate; the pattern 204 may be a semi-transparent phase shifter layer that may cause a phase shift to the light passing through it; the defect 203 may be a missing pattern. More specifically, according to the circuit design, there is supposed to be a semi-transparent phase shifter layer on the place where the defect 203 is located. Although in the illustrated embodiment, the defect 203 is implemented as a missing pattern, a variety of patterns that are not in accordance with the circuit design may be considered as defects such as for example, a misplaced pattern, an inadvertently added pattern, and/or a contaminated pattern. In some embodiments, the formed pattern 204 may be made of a material that is selected from the group comprising of molybdenum silicide, tantalum silicide, tungsten silicide, molybdenum silicon oxide, tantalum silicon oxide, and tungsten silicon oxide.

The method 100 continues at operation 104 with inspecting the mask 200 to identify/locate a defect (e.g., 203) using a mask inspection tool, such as an optical inspection tool and/or an atomic force microscope (AFM). Inspecting the mask includes scanning a surface of the mask, locating a defect on the mask, determining the shape and the size of the defect, and/or any suitable inspection approach to identify/locate a defect.

In a specific embodiment, the method 100 may optionally continue at operation 106 with removing the defect. In some embodiments, operation 106 may exist while the defect 203 is a misplaced pattern, an inadvertently added pattern, and/or a contaminated pattern. As such, the defect 203 may be removed by a variety of methods that are suitable to remove a formed pattern such as for example, a dry etching approach, a selectively dry etching, and/or a wet etching method.

Figure 2B:
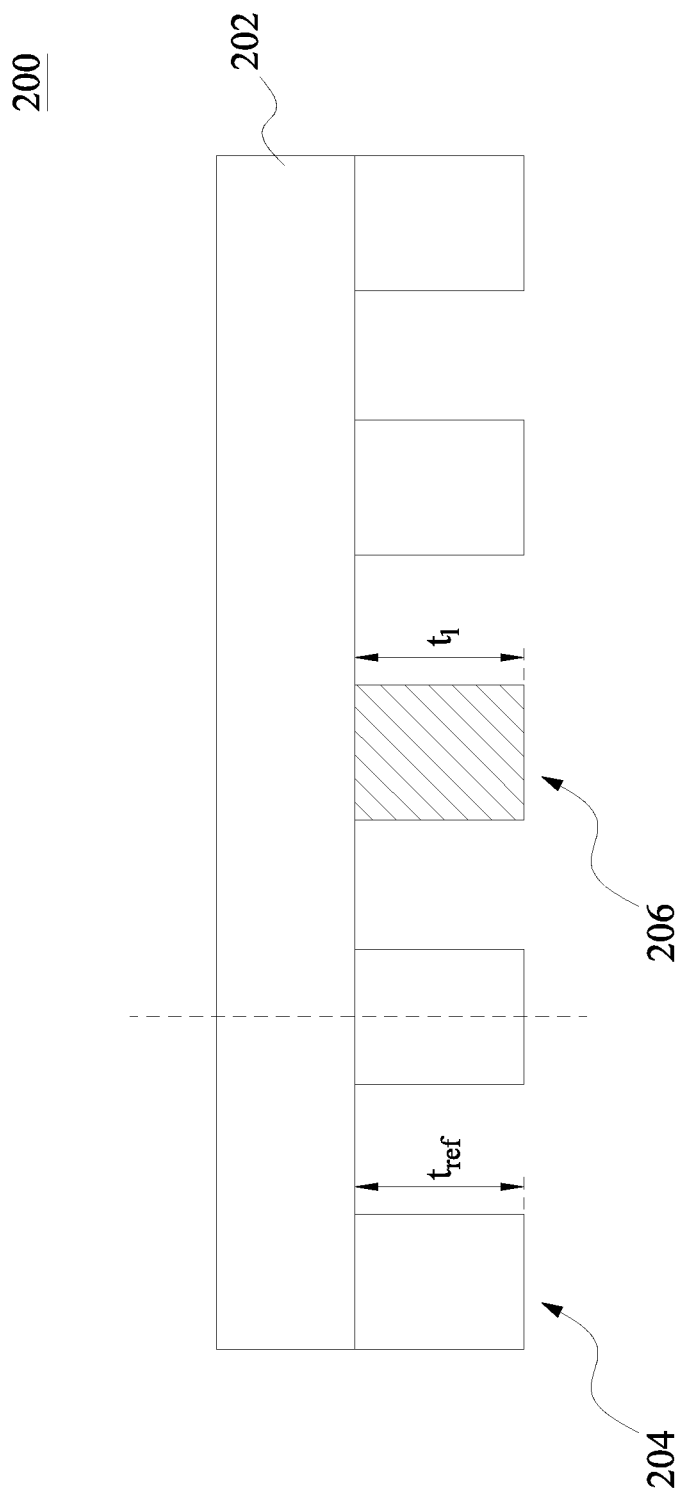
FIG. 2B is a cross-sectional view of a phase shift mask (PSM) including a repaired pattern according to one or more embodiments of the present invention.

After locating the defect 203, the method 100 continues at operation 108 with forming a first layer at the position in which the defect 203 is located (i.e., with respect to operation 104 of the method 100). FIG. 2B illustrates an exemplary embodiment of forming a first layer (pattern) 206 at the defect position such that the formed pattern 206 may serve as a pattern (e.g., 204) that was supposed to be originally located at the defect position. For clarity, in the following discussion, the pattern 206 may be referred to as a "repaired pattern" and the pattern 204 may be referred to as an "original pattern". In accordance with various illustrative embodiments, the repaired pattern 206 may be formed of a material that is identical to the original pattern 204 (e.g., molybdenum silicide, tantalum silicide, tungsten silicide, molybdenum silicon oxide, tantalum silicon oxide, and tungsten silicon oxide) or of a different material. In the example of the same material being used to form the repaired pattern 206, the thickness of the repaired pattern 206, $t_1$, may be the same as the thickness of the original pattern 204, $t_{ref}$. On the other hand, in the example of a different material being used to form the repaired pattern 206, the thickness $t_1$ of the repaired pattern 206 may be different from the thickness $t_{ref}$.

In accordance with various embodiments, the original pattern 204 has a refractive index. More specifically, such a refractive index may be a complex refractive index which has a first part (real part), $n_{ref}$, and a second part (imaginary part), $k_{ref}$. The first part $n_{ref}$ is generally referred to as the refractive index of the pattern 204 and the second part $k_{ref}$ is generally referred to as the attenuation factor of the pattern 204. The refractive index $n_{ref}$ and the attenuation factord $k_{ref}$ of the pattern 204 may be determined at operation 108 and/or at any other suitable operations (e.g., 102, 104, or 106) of the method 100 by using a suitable measurement system. For example, a variety of measurement systems that may be used to measure such a refractive index include an Aerial Image Measurement System (AIMS), a spectroscopic ellipsometry, a surface plasma resonance (SPR) angle detection system, and/or an attenuated total reflection (ATR) intensity measurement.

At operation 108, continuing with the example of a different material being used to form the repaired pattern 206, the repaired pattern 206 may be formed of a material (hereinafter referred as material "X"). For example, the material used for the original pattern 204 may be molybdenum silicide; the material X may be any suitable material other than molybdenum silicide. In an example, the material X may be a complex chemical compound of a variety of elements such as for example, Mo, Si, O, and N. Moreover, a ratio of each element of a complex chemical compound may be tuned so as to meet a target parameter (e.g., n, k value). In some embodiments, the material X and the thickness of the pattern 206 ($t_1$) to be formed may be chosen by a user and/or an information handling system based on the following parameters: the thickness of the original pattern 204 ($t_{ref}$), the refractive index ($n_{ref}$) of the original pattern 204, the attenuation factor ($k_{ref}$) of the original pattern 204, and transmittance ($T_{ref}$) of the original pattern 204. More specifically, the material X may have a complex refractive index that has a refractive index "$n_X$" and an attenuation factor "$k_X$". The refractive index $n_X$, the attenuation factor $k_X$, and the thickness $t_1$ may be accordingly chosen to satisfy the following equations:

$$(n_{ref}-1) \times t_{ref} = (n_X-1) \times t_1$$

$$(k_{ref}) \times t_{ref} = (k_X) \times t_1.$$

As such, the light propagating through the repaired pattern 206 may have a phase-shift (e.g., 180° or π), and in a further embodiment, that phase-shift of the light propagating through the repaired pattern 206 may be identical to one of the light propagating through the original pattern 204. Moreover, an intensity of the respective light propagating through the original pattern 204 and the repaired pattern 206 may be the same. That is, a transmittance of the repaired pattern 206 is identical to a transmittance of the original pattern 204.

Still referring to operation 108 of the method 100, the forming the repaired pattern 206 at the position in which the defect 203 is located may be implemented by a variety of deposition methods. In a specific example, such a deposition method may use a gas-assisted deposition (GAD), such as electron beam (e-beam) deposition, focused ion beam (FIB) deposition, or laser beam deposition with a chromium gas, TEOS, or other gas suitable for a GAD process.

Additionally or alternatively, the method 100 may optionally continue at operation 110 with forming one or more layers that overlay the first layer (i.e., the repaired pattern 206). In accordance with various embodiments, the one or more layers together with the first layer 206 may form another repaired pattern. Such a repaired pattern (i.e., the first layer +the one or more overlaying layers) may have similar or identical properties (e.g., transmittance, a phase-shift, etc.) to the original pattern 204. Moreover, each of the ore or more layers may be formed of a material that is identical to or different from the first layer, and each of the one or more layers may be formed of a corresponding material respectively. For example, each of the one or more layers may be formed of a material that is selected from a group consisting of: Cr, $SiO_2$, N, Mo. In some specific embodiments, a gaseous precursor in a gas-assisted focused electron beam system may be used to form each of the one or more layers. For example, $Cr(CO)_6$ may be used to form Cr; TEOS may be used to form $SiO_2$; $NO_2$ may be used to form N; and $Mo(CO)_6$ may be used to form Mo.

Figure 2C:
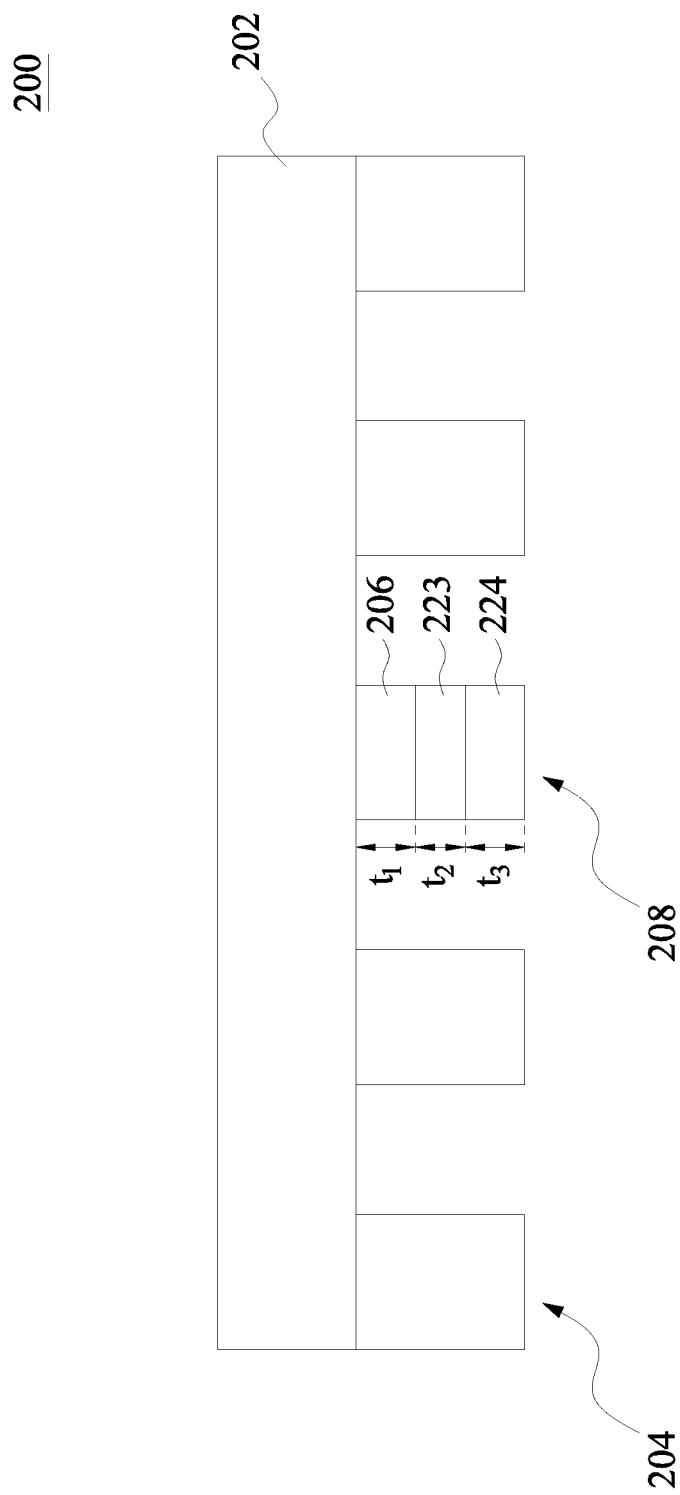
FIG. 2C is a cross-sectional view of a phase shift mask (PSM) including a repaired pattern according to one or more embodiments of the present invention.

In an illustrated embodiment of FIG. 2C, a repaired pattern 208 includes the first layer 206, a second layer 223, and a third layer 224. Each of the layers may be formed of a respective material: material X (layer 206), material Y (layer 223), and material Z (layer 224) and includes a respective thickness: $t_1$ (layer 206), $t_2$ (layer 223), and $t_3$ (layer 224). Each material may have a corresponding complex refractive index. For example, material X has a complex refractive index that has a refractive index "$n_X$" and an attenuation factor "$k_X$"; the material Y has a complex refractive index that has a refractive index "$n_Y$" and an attenuation factor "$k_Y$"; the material Z has a complex refractive index that has a refractive index "$n_Z$" and an attenuation factor "$k_Z$". As discussed above, the material and the thickness for each of the layers of the repaired pattern 208 may be chosen in order to cause the phase-shift of the light propagating through the repaired pattern 208 to be identical to the phase-shift of the light propagating through the original pattern 204 and a transmittance of the repaired pattern 208 is identical to the transmittance of the original pattern 204. In some specific embodiments, the thickness, the refractive index, and the attenuation factor of each of the layers may satisfy the equation given below:

$$(n_{ref}-1) \times t_{ref} = (n_X-1) \times t_1 + (n_X-1) \times t_2 + (n_Z-1) \times t_3$$

$$(k_{ref}) \times t_{ref} = (k_X) \times t_1 + (k_Y) \times t_2 + (k_Z) \times t_3.$$

Similarly, the forming of each layer of the repaired pattern 208 at the position in which the defect 203 is located may be implemented by a variety of deposition methods. In a specific example, such a deposition method may use a gas-assisted deposition (GAD), such as electron beam (e-beam) deposition, focused ion beam (FIB) deposition, or laser beam deposition with a chromium gas, TEOS, or other gas suitable for a GAD process.

Conventionally, in order to repair a photomask (e.g., replacing a missing pattern), especially a photo shift mask (PSM), a material other than the material used to form an original pattern is used to form a repaired pattern. Such a conventional method may be able to provide a similar critical dimension as the missed pattern does, but it may be disadvantageously subjected to issues such as for example, a degraded image log-slope (ILS), and/or a deviated phase-shift/transmittance, which in turn may cause a pattern formed on a substrate through the repaired pattern to deviate from a desired design (i.e., the original pattern). Such issues may result from a variety of reasons such as for example, overlooking one of the properties of the original pattern (e.g., the phase-shift of the original pattern, the transmittance of the original pattern).

The present disclosed method and system provide various advantages in various embodiments. In an example, a repaired pattern may be formed of a chosen material and formed with a chosen thickness such that the properties (e.g., the refractive index and the attenuation factor) and the thickness of the chosen material satisfy the two equations given above (the equations discussed in paragraph [0014]). In another example, a repaired pattern may be formed of at least two chosen materials and each chosen material may be formed with a chosen thickness such that the properties (e.g., the refractive index and the attenuation factor) and the thickness of each chosen material satisfy the two equations given above (the equations discussed in paragraph [0016]). As such, the repaired pattern may reproduce the same properties (the phase-shift and the transmittance) as the original pattern, which in turn may advantageously transfer an originally design pattern (e.g., a circuit design on a mask) onto a substrate.

Thus, the present disclosure provides embodiments of a method of repairing a mask. The method includes receiving a mask that includes a patterned feature and a defect, the patterned feature producing a phase-shift and having a transmittance and repairing the defect by forming a repaired feature, the repaired feature producing the phase-shift and having the transmittance.

The present disclosure also provides other embodiments of a method. The method includes receiving a mask that includes a patterned feature, the patterned feature producing a phase-shift and having a transmittance; identifying a defect region on the mask; and forming a repair feature over the defect region on the mask, wherein forming the repair feature includes forming a first patterned material layer over the defect region and forming a second patterned material layer over the first patterned material layer to form the repair feature, the repair feature producing the phase-shift and having the transmittance.

The present disclosure also provides an embodiment of a phase shift mask (PSM) for fabricating an integrated circuit. The PSM includes a transparent substrate; an original feature that has a reference complex refractive index and a reference thickness ($t_{ref}$); and a repaired feature including a first layer that has a first complex refractive index and a first thickness ($t_1$). More specifically, the first thickness is chosen to cause a phase-shift and a transmittance of the repaired feature to be respectively identical to a phase-shift and a transmittance of the original feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a mask that includes a patterned feature and a defect, the patterned feature producing a phase-shift and having a transmittance; and
   repairing the defect by forming a repaired feature, the repaired feature producing the phase-shift and having the transmittance.

2. The method of claim 1, wherein the forming of the repaired feature includes directing a focused electron beam on the defect of the mask.

3. The method of claim 1, further comprising inspecting the mask with a mask inspection tool to identify the defect.

4. The method of claim 1, wherein the repaired feature includes a first layer having a first thickness and a first complex refractive index, a second layer having a second thickness and a second complex refractive index, and a third layer having a third thickness and a third complex refractive index.

5. The method of claim 4, wherein the first, second, and third complex refractive indexes are different.

6. The method of claim 1, wherein the mask is a phase shift mask (PSM).

7. The method of claim 1, wherein the pattern feature is a semi-transparent layer of the mask and is formed of a material that is selected from the group comprising of molybdenum silicide, tantalum silicide, tungsten silicide, molybdenum silicon oxide, tantalum silicon oxide, and tungsten silicon oxide.

8. The method of claim 1, wherein repairing the defect includes removing the defect from the mask.

9. The method of claim 1, further comprising inspecting the mask with a mask inspection tool to identify the defect.

10. The method of claim 1, wherein the pattern feature is a semi-transparent layer of the mask and is formed of a material that is selected from the group comprising of molybdenum silicide, tantalum silicide, tungsten silicide, molybdenum silicon oxide, tantalum silicon oxide, and tungsten silicon oxide.

11. The method of claim 1, wherein the repaired feature has the same thickness as the patterned feature.

12. A method, comprising:
    receiving a mask that includes a patterned feature, the patterned feature producing a phase-shift and having a transmittance;
    identifying a defect region on the mask; and
    forming a repair feature over the defect region on the mask, wherein forming the repair feature includes forming a first patterned material layer over the defect region and forming a second patterned material layer over the first patterned material layer to form the repair feature, the repair feature producing the phase-shift and having the transmittance.

13. The method of claim 12, wherein the patterned feature has a reference complex refractive index and wherein the reference complex refractive index has a first reference coefficient ($n_{ref}$) and a second reference coefficient ($k_{ref}$), and wherein the formed feature has a total complex refractive index having a first coefficient ($n_1$) and a second coefficient ($k_1$).

14. The method of claim 13, wherein the first reference coefficient ($n_{ref}$), the second reference coefficient ($k_{ref}$), the first coefficient ($n_1$), and the second coefficient ($k_1$) simultaneously satisfy equations:

$$(n_{ref}-1) \times t_{ref} = (n_1-1) \times t_1 \text{ and}$$

$$(k_{ref}) \times t_{ref} = (k_1) \times t_1.$$

15. The method of claim 12, wherein the first material layer has a first thickness and a first complex refractive index and the second material layer has a second thickness and a second complex refractive index.

16. The method of claim 15, wherein the first and second complex refractive indexes are different, and
    wherein the first and second thicknesses are different.

17. The method of claim 12, wherein forming the repair feature includes directing a focused electron beam over the defect region of the mask.

18. The method of claim 12, wherein the mask is a phase shift mask (PSM).

19. A method comprising:
    receiving a mask that includes a patterned feature and a defect, the patterned feature formed of a material that produces a phase-shift and has a transmittance; and
    repairing the defect by forming a repaired feature, the repaired feature formed of the material that produces the phase-shift and has the transmittance.

20. The method of claim 19, wherein the forming of the repaired feature includes directing a focused electron beam on the defect of the mask.

* * * * *